United States Patent [19]

Takaya

[11] Patent Number: 5,783,967

[45] Date of Patent: Jul. 21, 1998

[54] FREQUENCY SHIFT KEYING DEMODULATION CIRCUIT USING LOGIC CIRCUITRY

[75] Inventor: Kazuhiko Takaya, Chiba, Japan

[73] Assignee: Seiko Instruments Inc., Japan

[21] Appl. No.: 717,493

[22] Filed: Sep. 20, 1996

[30] Foreign Application Priority Data

| Sep. 21, 1995 | [JP] | Japan | 7-243474 |
| Sep. 21, 1995 | [JP] | Japan | 7-243476 |
| Sep. 12, 1996 | [JP] | Japan | 8-241675 |

[51] Int. Cl.[6] .................. H03D 3/00; H04L 27/14
[52] U.S. Cl. .................. 329/303; 329/302; 375/328; 375/334
[58] Field of Search .................. 329/300–303; 375/324–328, 334–337

[56] References Cited

U.S. PATENT DOCUMENTS

| 4,238,783 | 12/1980 | Miller | 375/335 X |
| 5,453,714 | 9/1995 | Madsen | 329/303 X |
| 5,612,976 | 3/1997 | Granger-Jones | 329/303 X |

*Primary Examiner*—David Mis
*Attorney, Agent, or Firm*—Adams & Wilks

[57] ABSTRACT

A miniaturized FSK demodulation circuit for accurately demodulating a signal having a small modulation index comprises a multiplier for multiplying a FSK modulated input signal by 4, an oscillator for generating a first signal having the same frequency and phase as the input signal, a phase shifter for producing a second signal by phase shifting the first signal by 90°, a first mixer receptive of the multiplied input signal and the first signal for producing a first mixed signal, a second mixer receptive of the multiplied input signal and the second signal for producing a second mixed signal, low pass filters and limiter circuits for converting baseband frequency components of the first and second mixed signals into first and second digital signals, a phase detector for detecting a phase shift in accordance with a difference in phase between the first and second digital signals in accordance with four rising and falling edges of the first and second digital signals, a counter for counting the number of rising and falling edges of the first and second digital signals, a signal decoding circuit receptive of output signals of the phase detector and the counter, and a synchronizing circuit receptive of output signals of the decoding circuit and the counter.

18 Claims, 6 Drawing Sheets

FREQUENCY SHIFT KEYING DEMODULATION CIRCUIT USING LOGIC CIRCUITRY

BACKGROUND OF THE INVENTION

The present invention relates to a digital Frequency Shift Keying (FSK) demodulation circuit.

The following prior digital FSK demodulation circuits have been known:

These include a circuit combining a quadrature detector, a low pass filter, and a comparator shown in FIG. 6; an orthogonal demodulation circuit (not shown); and a circuit described in Japanese Open Patent H3-112241. In FIG. 6, symbol 61 is an input terminal, symbol 62 is a phase delay circuit, symbol 63 is an exclusive OR circuit, symbol 64 is a low pass filter, symbol 65 is a comparator, and symbol 66 is an output terminal. In the prior multiplying technique for multiplying frequency and modulation index by n times multiplying by n, the following circuits have been known: These are a digital multiplier circuit using an exclusive OR circuit shown in FIG. 7; and multiplier circuits described in Japanese Open Patent H2-177715, H3-169715, and H4-222112. In FIG. 7, symbol 71 is a delay circuit, and symbol 72 is an exclusive OR circuit.

In the prior digital FSK demodulation circuit combining the quadrature detector, the low pass filter, and the comparator shown in FIG. 6, a delay element is required. In the case that the modulation index m of a signal demodulated by FSK is small, a comparator having a high detecting sensitivity must has to be used, and a standard input voltage level has to be set carefully as eye aperture of eye pattern of output from the low pass filter. Further, as a feedback technique has to be used, the scale of the circuit becomes large. As bit error factor becomes worse when the detecting sensitivity of the comparator is raised, it is difficult to realize a reproducible and unadjustable circuit.

In the multiplier circuit described in laid Open Patent H3-112241, when a signal having a modulation index m of the signal modulated by FSK, a high speed clock for driving a shift resister used in the FSK demodulation circuit is required. This causes an increase in current consumption and deterioration of sensitivity.

Further, it is difficult to integrate the FSK demodulation circuit constructed by the prior art technique on a semiconductor.

SUMMARY OF THE INVENTION

To solve the above-mentioned problems, the present invention has a circuit detecting orthogonally by increasing the modulation factor m of a signal modulated by FSK by multiplying. Defining the frequency of input signal modulated by FSK as f, and defining the modulation factor as m, the frequency becomes n×f, and the modulation factor becomes n×m when the input signal is multiplied by n. The signal multiplied by n is respectively input to one input terminal of first and second exclusive OR (EX-OR) circuits. On the other hand, a first signal, the frequency of which is equal to frequency nf multiplied, and a second signal, the phase of which shifts 90 degrees from the phase of the first signal, are generated by a mixed signal generating circuit. The first and second signals are input to the other input terminals of the first and second EX-OR circuits. After output signals of the first and second EX-OR circuit are changed to base band frequency by first and second low pass filters or integration circuits, the signals are changed to first and second digital signals by first and second limiter circuits.

A direction of the phase rotation of input signal modulated by FSK is distinguished by checking the phase deviation of the first and second digital signals. The distinction of rotation direction is achieved by checking the logical value of each digital signal at a total four edges, which are rising edges and falling edges of the first and second digital signals. Demodulation completes here in demodulation of 2-FSK. In a 4-FSK modulation wave or many valued FSK modulation wave, not only rotation direction but also rotation speed has to be detected. The detection of rotation speed is achieved by a counter used for counting pulses of the first and second digital signals. When the counted value is over a threshold valve, frequency deviation is distinguished to be large, and when the counted value is not over the threshold, frequency deviation is distinguished to be small. Demodulation of 4-FSK is carried out by combination of the above-mentioned distinction of rotation direction and distinction of rotation speed.

In the present invention, a multiplier circuit is formed at the former part of an FSK demodulation circuit. A counter is formed to demodulate accurately a 4-FSK modulation wave, and a synchronizing circuit is formed to demodulate at the center of an eye pattern. The output of the multiplier circuit is desirable to be 50% of duty ratio. As the normal demodulation is not carried out if the duty ratio deviates more than 3% from 50%, using the multiplier circuit of 50% in duty ratio is a key point. The multiplier circuit used in the present invention has the following construction. A means is formed, which automatically corrects the delay of two voltage control delay circuits so that the output signal passed through two voltage control delay circuits connected in series delayed 180 degrees in phase from an input signal. Using a phase comparator for the means, for example, a signal multiplied by 2 of 50% duty ratio is formed by the input signal and the output signal of the first voltage control delay circuit, the phase of which shifts 90 degrees from the input signal. A signal multiplied by 4 is formed by connecting two above-mentioned multiplier circuits in series.

In the mixed signal generation circuit, a first output signal being equal to the multiplied input signal and a second output signal being delayed 90 degrees in phase by means such as a flip flop are made, the first signal is input to one input terminal of a first exclusive OR circuit, the second signal is input to one input terminal of a second exclusive OR circuit, and the multplied input signal is input to the other input terminal of the first and second exclusive OR circuits. These first and second exclusive OR circuits operate as a mixer circuit.

First and second low pass filters (LPFs) are connected to first and second exclusive OR circuits respectively to cut off a high frequency component. Output of the first low pass filter is input to a first limiter circuit, and output of the second low pass filter is input to a second limiter circuit to digitize output of the first and second low pass filters. Defining the output of the first limiter circuit as I and the output of the second limiter circuit as Q, demodulation is carried out by checking phase of the output signal Q with respect to the output signal I. Actually, demodulation is carried out often using the value of the other digital signal at each rising and falling edge of the output signals I and Q.

When deviation of the first and second signals from the mixed signal generation circuit with respect to the input signal modulated by FSK is more than the modulation index, and when a 4-FSK signal or many valued FSK signal is demodulated, a 4-FSK signal or many valued FSK signal having a small phase deviation can be demodulated by counting the frequency of a total of four rising and falling edges of the output signals I and Q by use of the counter.

DETAILED DESCRIPTION OF THE INVENTION

Referring the drawings, an embodiment of the present invention is explained.

Figure 1:
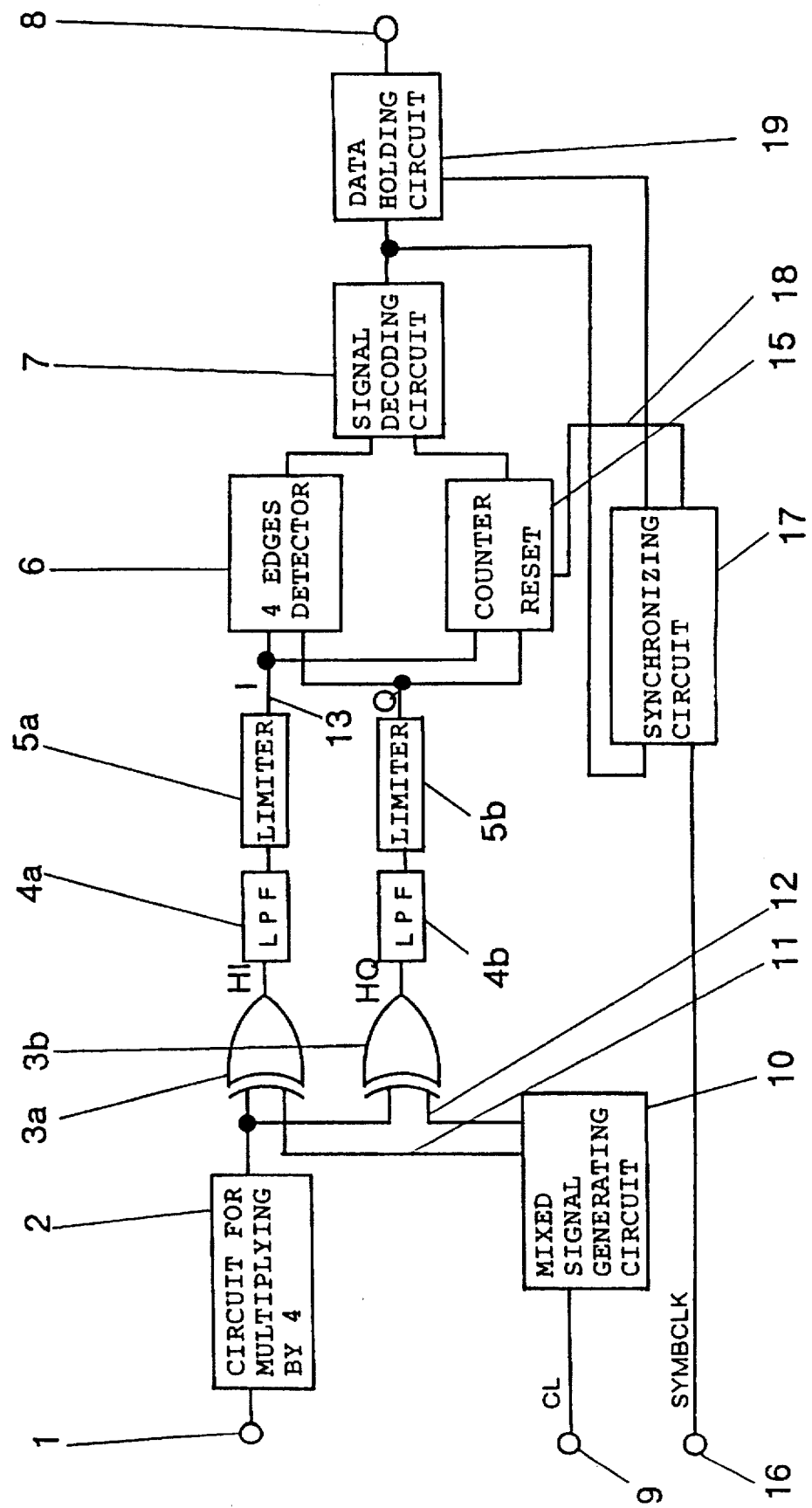
FIG. 1 is a circuit diagram of an FSK demodulation circuit of the present invention.

FIG. 1 is a circuit diagram of an FSK demodulation circuit in an embodiment of the present invention.

In FIG. 1, symbol 1 is an input signal terminal, symbol 2 is a multiply by 4 circuit, symbols 3a and 3b are exclusive OR circuits, symbols 4a and 4b are low pass filters (LPFs), symbols 5a and 5b are limiter circuits, symbol 6 is a phase detector (4 edges detector), symbol 7 is a signal decoding circuit, symbol 8 is a demodulation output terminal, symbol 9 is a clock input terminal, symbol 10 is a mixed signal generating circuit, symbol 15 is a counter, symbol 16 is a symbol clock input terminal, and symbol 17 is a synchronizing circuit. The operation of the FSK demodulation circuit constructed as described above is now explained. An input signal modulated by FSK is input from input signal terminal 1 to the FSK demodulation circuit. After that, the FSK modulated input signal is multiplied by 4 by the multiply by 4 circuit 2. The frequency of the FSK modulated input signal thus becomes four times the original frequency, and the modulation index the original modulation index becomes four times.

Figure 2:
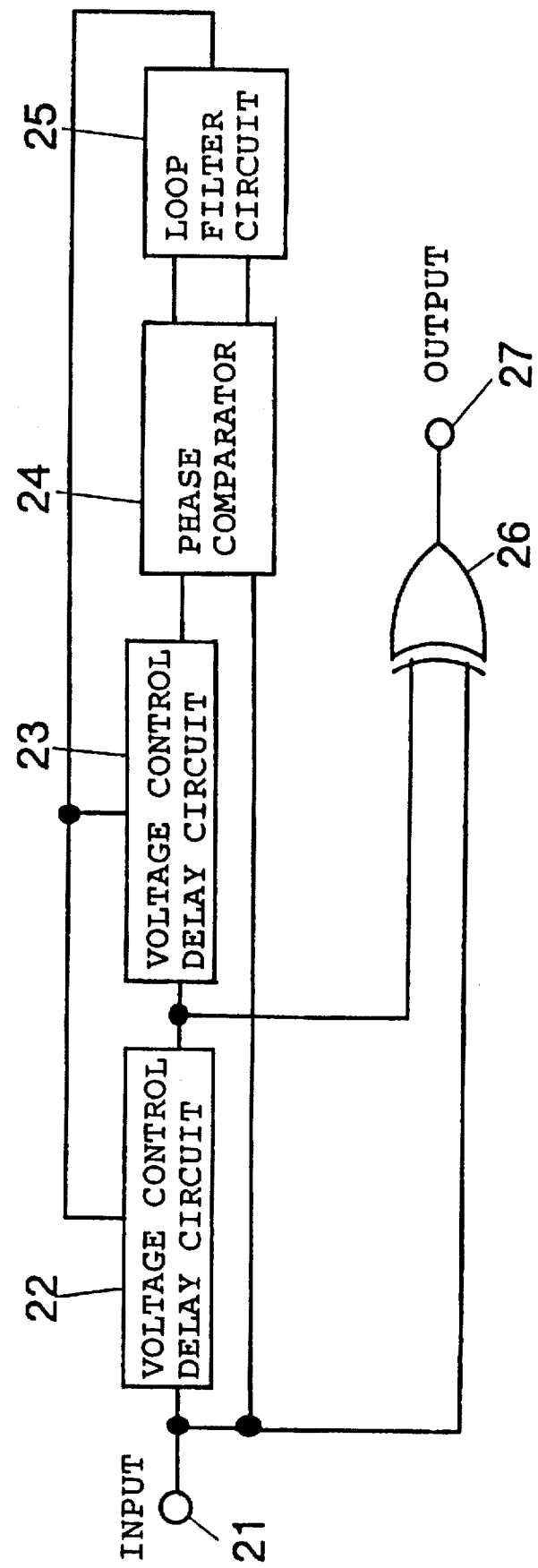
FIG. 2 is a circuit diagram of the multiplier circuit shown in FIG. 1.

An example of multiplier circuit is shown in FIG. 2.

In FIG. 2, symbol 21 is an input terminal, symbol 22 is a first voltage control delay circuit, symbol 23 is a second voltage control delay circuit, symbol 24 is a phase comparator, symbol 25 is a loop filter, symbol 26 is an exclusive OR circuit, and symbol 27 is an output terminal. A circuit for multiplying by 4 is formed by connecting two multiplier circuits of FIG. 2 in series.

Figure 3:
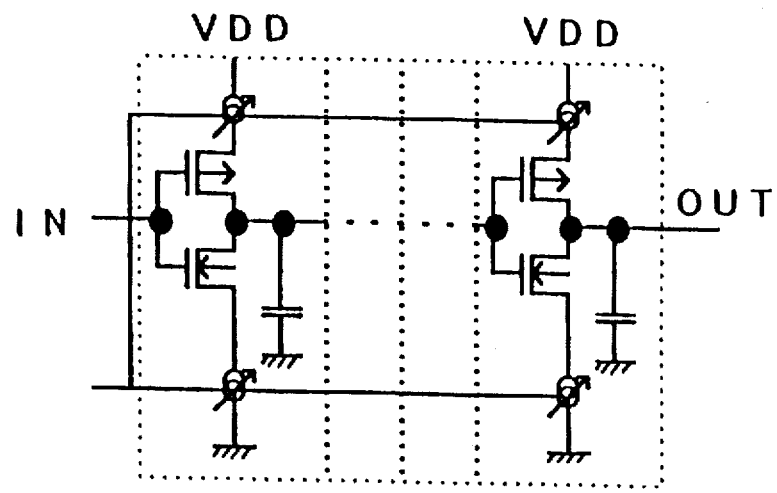
FIG. 3 is a circuit diagram of the voltage control delay circuit shown in FIG. 2.

An example of the voltage control delay circuit shown in FIG. 2 is shown in FIG. 3.

Figure 4:
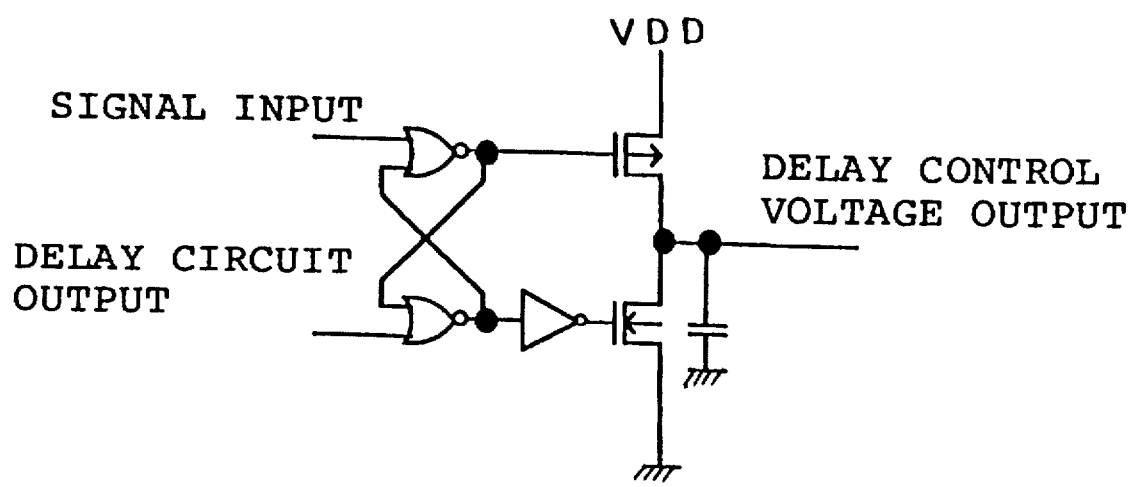
FIG. 4 is a circuit diagram of the phase comparator and loop filter shown in FIG. 2.

Each example of the phase comparator and the loop filter is shown in FIG. 4. The signal multiplied by 4 is input to one input terminal of the exclusive OR circuits 3a and 3b.

A clock signal CL is input to clock input terminal 9. Mixed signal generation circuit 10 generates the same signal as above-mentioned first signal multiplied by 4, and a second signal, the frequency of which is equal to above-mentioned signal multiplied by 4, and the phase of which differs 90 degrees from the clock signal CL.

The first and second signals are input to exclusive OR circuits 3a and 3b through signal lines 11 and 12. Output signals HI and HQ of exclusive OR circuits 3a and 3b become signals modulated by PWM changing the same times as the number equal to modulation index during each one symbol rate.

Then, the base band frequency is obtained by low pass filters 4a and 4b.

Defining the input signal modulated by FSK as cos($\omega ct\pm\Delta\omega t$), a signal multiplied by 4 by the circuit for multiplying by 4 becomes cos($4\omega ct\pm 4\Delta\omega t$).

The first signal cos($4\omega ct$) and the second signal cos($4\omega ct+\pi/2$) are output from mixed signal generating circuit 10. Output signals HI and HQ of exclusive OR circuits 3a and 3b are input to low pass filters 4a and 4b respectively. Output signals cos($4\Delta\omega t\pm\pi/2$) and cos($4\Delta\omega t$) are output from the output terminals of low pass filters 4a and 4b.

When these two output signals are input to limiter circuits 5a and 5b, first and second digital signals are output from the limiter circuits 5a and 5b. When the frequency deviation of the input signal modulated by FSK is positive, the first digital signal advances $\pi/2$ in phase with respect to the second digital signal, and when the frequency deviation of the input signal modulated by FSK is negative, the first digital signal is delayed by $\pi/2$ in phase with respect to the second digital signal.

A phase detector (4 edges detector) 6 is used to detect advance and delay of the phase.

Figure 5:
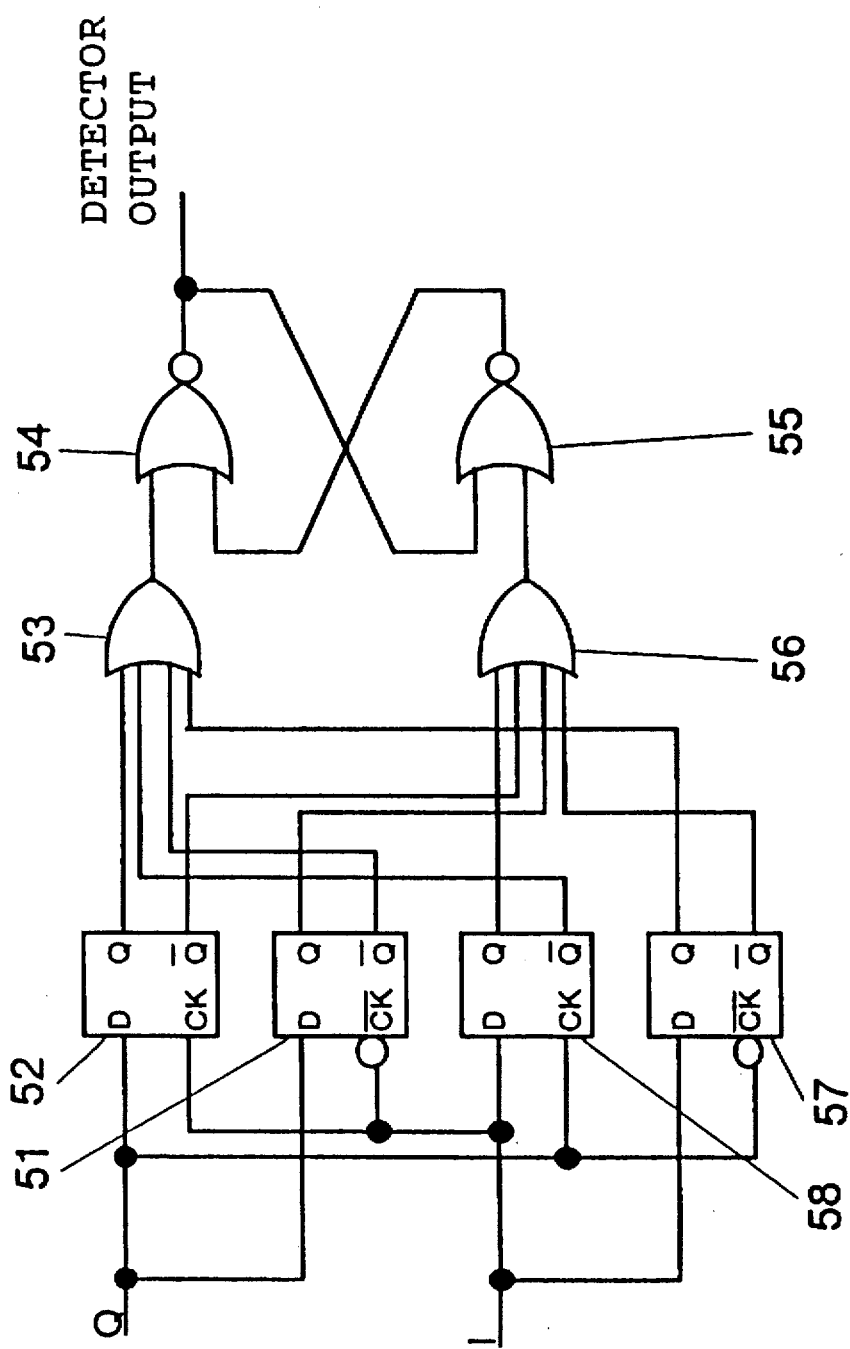
FIG. 5 is a circuit diagram of a an example of phase detector (4 edges detector) shown in FIG. 1.
Figure 6:
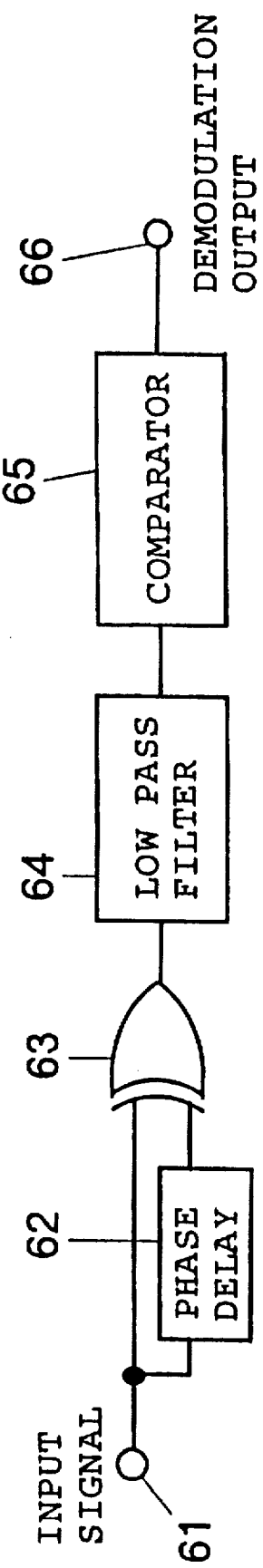
FIG. 6 is a circuit diagram of a prior art FSK demodulation circuit.
Figure 7:
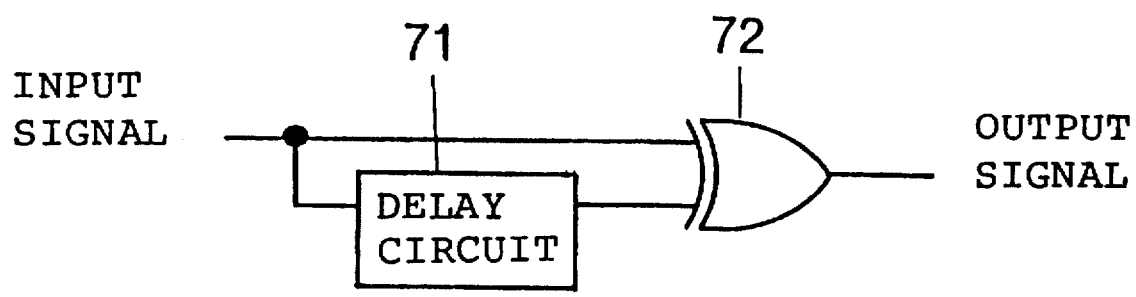
FIG. 7 is a circuit diagram of a prior art multiplier circuit.

An example of the circuit of phase detector 6 is shown in FIG. 5.

In FIG. 5, symbols 51, 52, 57, and 58 are D flip flops, symbols 53 and 56 are 4 input OR circuits, and symbols 54 and 55 are 2 inputs NOR circuits. The advance and delay of phase are detected using four edges consisting of the rising and falling of the first and second digital signals. When the value of the second digital signal is high at the rising edge of the first digital signal, it is determined that the phase of the second digital signal advances and frequency deviation is positive. When the value is low, it is determined that the phase of the second digital delayed and frequency deviation is negative.

When the value of the second digital signal is low level at the falling edge of the first digital signal, it is determined that the phase of the second digital advances and frequency deviation is positive. When the value of the second digital signal is high, it is determined that the phase of the second digital is delayed and frequency deviation is negative. When the value of first digital signal is high at the rising edge of the second digital signal, it is determined that the phase of the first digital is delayed and frequency deviation is positive. When the value is high, it is distinguished that phase of the first digital delays and frequency deviation is negative. When the value of first digital signal is high level at falling edge of the second digital signal, it is distinguished that the phase of the first digital is delayed and frequency deviation is positive. When the value is low, it is distinguished that the phase of the first digital advances and frequency deviation is negative.

The operation is applied only to 2-FSK modulation signal because the above-mentioned 4 edges detector 6 cannot distinguish frequency deviation alone. In order to apply to 4-FSK modulation, a counter 15 is used. Output signals of low pass filters 4a and 4b are cos($4\Delta\omega t\pm\pi/2$) and cos($4\Delta\omega t$). The period of these signals is $\frac{1}{4}\Delta\omega\cdot 2\pi$, which is defined as Ti. A pulse generated at edges of the first and second digital signals is input to reset the counter. The number of counter and clock frequency are set so as to generate carry somewhere in between two values defined by period Ti. When period Ti is small a, carry is not generated because the counter is reset often, and the frequency deviation of the input signal is determined to be small. When period Ti is large, the frequency deviation of input signal is distinguished to be large because the counter is reset after the carry generates. The 4-FSK signal is demodulated by inputting outputs of phase detector 6 and counter 15 to signal decoding circuit 7.

Outputs of signal decoding circuit 7 and symbol rate clock are synchronized by inputting them to synchronizing circuit 17 as the signal occasionally is not demodulated correct at border area of symbol by noise. Two kinds of signals are output from the synchronizing circuit. the phase of one of them is the same as the symbol rate, and other of them differs 90 degrees from the symbol rate. The signal having the same as symbol rate is used as counter reset circuit 18 of counter 15. The signal differs 90 degrees is phase from symbol rate is used as the clock of data holding circuit 19, and a demodulated base band signal without noise is gained from demodulation output terminal 8.

As mentioned above, it is possible that the present invention carries out demodulation which is a little in bit false because modulation index becomes 4 m, namely frequency deviation becomes 4Δωt, by using FSK demodulation circuit even if modulation index is small, namely frequency deviation is only Δωt. Further, the circuit is possible to be integrated on the semiconductor as the circuit consists of above-mentioned construction.

What is claimed is:

1. An FSK demodulation circuit for demodulating an FSK signal, comprising: a frequency multiplier circuit for multiplying the frequency of the FSK signal; a mixed signal generation circuit for outputting a first signal and a second signal, the frequency and phase of the first signal being the same as those of the frequency multiplied FSK signal, and the second signal being out of phase from the first signal by 90 degrees; a first exclusive OR circuit responsive to the frequency multiplied FSK signal and the first signal and which operates as a mixer circuit; a second exclusive OR circuit responsive to the frequency multiplied FSK signal and the second signal and which operates as a mixer circuit; a first low pass filter responsive to an output signal of the first exclusive OR circuit for obtaining a baseband frequency component thereof; a first limiter responsive to the output signal of the first exclusive OR circuit for digitizing the output signal of the first exclusive OR circuit to produce a first digital signal; a second low pass filter responsive to an output signal of the second exclusive OR circuit for obtaining a baseband frequency component thereof; a second limiter responsive to the output signal of the second exclusive OR circuit for digitizing the output signal of the second exclusive OR circuit to produce a second digital signal and a phase detector responsive to the first digital signal and the second digital signal for carrying out a phase detection operation on the basis of the difference in phase between the first and second digital signals.

2. An FSK demodulation circuit according to claim 1; wherein the frequency multiplier circuit comprises first and second voltage control delay circuits connected in series, a phase comparator for comparing the phase of the FSK signal with the phase of the output signal of the second voltage control delay circuit, and a loop filter circuit responsive to the output signal from the phase comparator for sending a control signal to the first and second voltage control delay circuits, such that a delay of the first and second voltage control delay circuits is automatically corrected in response to the control signal in such a way that a signal passing through the first and second voltage control delay circuits is phase-delayed by 180 degrees and a double freguency-multiplied signal with a duty ratio of 50% is produced by the use of an exclusive OR circuit on the basis of the FSK signal and the output signal from the first voltage controlled delay circuit.

3. An FSK demodulation circuit according to claim 1; wherein the phase detector operates on the basis of the value of one digital signal selected from the first and second digital signals at the time of the rising and falling edges of the other of the first and second digital signals.

4. An FSK demodulation circuit according to claim 3; further comprising a counter for counting a frequency of the occurrence of a total of four rising and falling transitions of the first and second digital signals; and a signal decoding circuit responsive to the output signals of the counter and the phase detector for outputting a demodulated signal of the FSK signal.

5. An FSK demodulation circuit according to claim 4; further comprising a synchronizing circuit responsive to the output signal of said signal decoding circuit and a reference signal whose symbol rate is the same as that of the FSK signal for generating a synchronizing signal, a data holding circuit responsive to the synchronizing signal for synchronizing the output signal of said decoding circuit, and means responsive to the synchronizing signal for resetting said counter.

6. An FSK demodulation circuit for demodulating an FSK modulated input signal, comprising: a multiplier for multiplying the frequency and modulation factor of the input signal and producing a multiplied input signal; an oscillator for generating a first signal having the same frequency as the input signal; a phase shifter for producing a second signal by phase shifting the first signal by 90°; a first mixer receptive of the multiplied input signal and the first signal for producing a first mixed signal; a second mixer receptive of the multiplied input signal and the second signal for producing a second mixed signal; means for converting baseband frequency components of the first and second mixed signals into first and second digital signals; and a phase detector for detecting a phase shift in accordance with a difference in phase between the first and second digital signals.

7. An FSK demodulation circuit according to claim 6; wherein the first and second mixers comprise first and second exclusive OR circuits.

8. An FSK demodulation circuit according to claim 6; wherein the means for converting comprises a first low pass filter connected to the first mixer for outputting a baseband frequency component of the first mixed signal; a first limiter circuit connected to the first low pass filter for outputting the first digital signal; a second low pass filter connected to the second mixer for outputting a baseband frequency component of the second mixed signal, and a second limiter circuit connected to the second low pass filter for outputting the second digital signal.

9. An FSK demodulation circuit according to claim 6; wherein the multiplier comprises first and second series-connected voltage controlled delay circuits connected; a phase comparator for comparing the phase of the input signal with the phase of an output signal of the second voltage controlled delay circuit; a loop filter responsive to the output signal of the phase comparator for producing a control signal for controlling the first and second voltage controlled delay circuits to automatically correct a delay thereof such that an input signal passing through the first and second voltage controlled delay circuits is delayed in phase by 180°; and an exclusive OR circuit receptive of the input signal and an output signal of the first voltage controlled delay circuit for outputting a frequency doubled output signal having a duty ratio of 50%.

10. An FSK demodulation circuit according to claim 6; wherein the phase detector includes means for detecting a phase shift on the basis of the value of one of the first and second digital signals at a time of the rising and falling edges of the other one of the first and second digital signals.

11. An FSK demodulation circuit according to claim 10; further comprising a counter for counting a frequency of the occurrence of a total of four rising and falling transitions of the first and second digital signals; and a signal decoding circuit responsive to output signals of the counter and the phase detector for outputting a demodulated signal corresponding to the FSK modulated input signal.

12. An FSK demodulation circuit according to claim 11; further comprising a synchronizing circuit responsive to an output of the signal decoding circuit and a reference signal for generating a synchronizing signal; a data holding circuit responsive to the synchronizing signal for synchronizing the output signal of the decoding circuit; and means responsive to the synchronizing signal for resetting the counter.

13. An FSK demodulation circuit according to claim 6; wherein the phase detector includes means for detecting that the phase of the second digital signal has advanced in phase and that there has been a positive frequency deviation when the value of the second digital signal is high at a rising edge of the first digital signal.

14. An FSK demodulation circuit according to claim 6; wherein the phase detector includes means for detecting that the phase of the second digital signal is delayed in phase and that there has been a negative frequency deviation when the value of the second digital signal is low at a rising edge of the first digital signal.

15. An FSK demodulation circuit according to claim 6; wherein the phase detector includes means for detecting that the phase of the second digital signal has advanced in phase and that there has been a positive frequency deviation when the value of the second digital signal is low at a trailing edge of the first digital signal.

16. An FSK demodulation circuit according to claim 6; wherein the phase detector includes means for detecting that the phase of the second digital signal is delayed and that there has been a negative frequency deviation when the value of the second digital signal is high at a trailing edge of the first digital signal.

17. An FSK demodulation circuit according to claim 6; wherein the phase detector includes means for detecting that the first digital signal is delayed and that there has been a positive frequency deviation when the value of the first digital signal is high at a rising edge of the second digital signal.

18. An FSK demodulation circuit according to claim 6; wherein the phase detector includes means for detecting that the first digital signal is delayed and that there has been a positive frequency deviation when the value of the first digital signal is high at a trailing edge of the second digital signal.

* * * * *